(12) United States Patent
Wang

(10) Patent No.: US 9,082,490 B2
(45) Date of Patent: Jul. 14, 2015

(54) ULTRA-LOW POWER PROGRAMMING METHOD FOR N-CHANNEL SEMICONDUCTOR NON-VOLATILE MEMORY

(71) Applicant: FLASHSILICON INCORPORATION, Diamond Bar, CA (US)

(72) Inventor: Lee Wang, Diamond Bar, CA (US)

(73) Assignee: FlashSilicon Incorporation, Diamond Bar, CA (US)

( * ) Notice: Subject to any disclaimer, the term of this patent is extended or adjusted under 35 U.S.C. 154(b) by 0 days.

(21) Appl. No.: 13/920,886

(22) Filed: Jun. 18, 2013

(65) Prior Publication Data

US 2014/0369135 A1    Dec. 18, 2014

(51) Int. Cl.
*G11C 11/34*      (2006.01)
*G11C 16/10*      (2006.01)
*G11C 16/04*      (2006.01)

(52) U.S. Cl.
CPC ............ *G11C 16/10* (2013.01); *G11C 16/0466* (2013.01)

(58) Field of Classification Search
CPC ............................ G11C 16/0466; G11C 16/10
USPC ......................................... 365/185.26, 185.28
See application file for complete search history.

(56) References Cited

U.S. PATENT DOCUMENTS

| | | | |
|---|---|---|---|
| 5,559,735 A * | 9/1996 | Ono et al. | 365/185.3 |
| 6,141,250 A * | 10/2000 | Kashimura | 365/185.11 |
| 6,438,031 B1 * | 8/2002 | Fastow | 365/185.18 |
| 6,456,531 B1 * | 9/2002 | Wang et al. | 365/185.18 |
| 6,456,536 B1 * | 9/2002 | Sobek et al. | 365/185.28 |
| 6,459,618 B1 * | 10/2002 | Wang | 365/185.18 |
| 6,628,547 B2 * | 9/2003 | Ogura et al. | 365/185.18 |
| 2002/0101765 A1 * | 8/2002 | Mihnea et al. | 365/185.33 |
| 2005/0078529 A1 * | 4/2005 | Chen et al. | 365/185.33 |
| 2005/0157558 A1 * | 7/2005 | Noguchi et al. | 365/185.22 |
| 2005/0237801 A1 * | 10/2005 | Shih | 365/185.11 |
| 2008/0251831 A1 * | 10/2008 | Wu et al. | 257/315 |
| 2010/0311217 A1 * | 12/2010 | Wu et al. | 438/287 |

* cited by examiner

*Primary Examiner* — Anthan Tran
(74) *Attorney, Agent, or Firm* — Muncy, Geissler, Olds & Lowe, P.C.

(57) ABSTRACT

An Ultra-low power programming method for N-channel semiconductor Non-Volatile Memory (NVM) is disclosed. In contrast to the grounded voltage at the source electrode of an N-channel semiconductor NVM for the conventional Channel Hot Electron Injection (CHEI) programming, the source electrode in the programming method of the invention is necessarily floating with no voltage bias to prevent applied electrical fields toward the source electrode. The drain electrode of the N-channel semiconductor NVM is reversely biased with a positive voltage $V_{DB}$ relative to the substrate to facilitate the valence band electrons in the P-type substrate to tunnel to the conducting band of the N-type drain electrode. A positive high gate voltage pulse is then applied to the gate electrode of the N-channel semiconductor NVM to collect the surface energetic electrons toward the charge storage material.

5 Claims, 10 Drawing Sheets

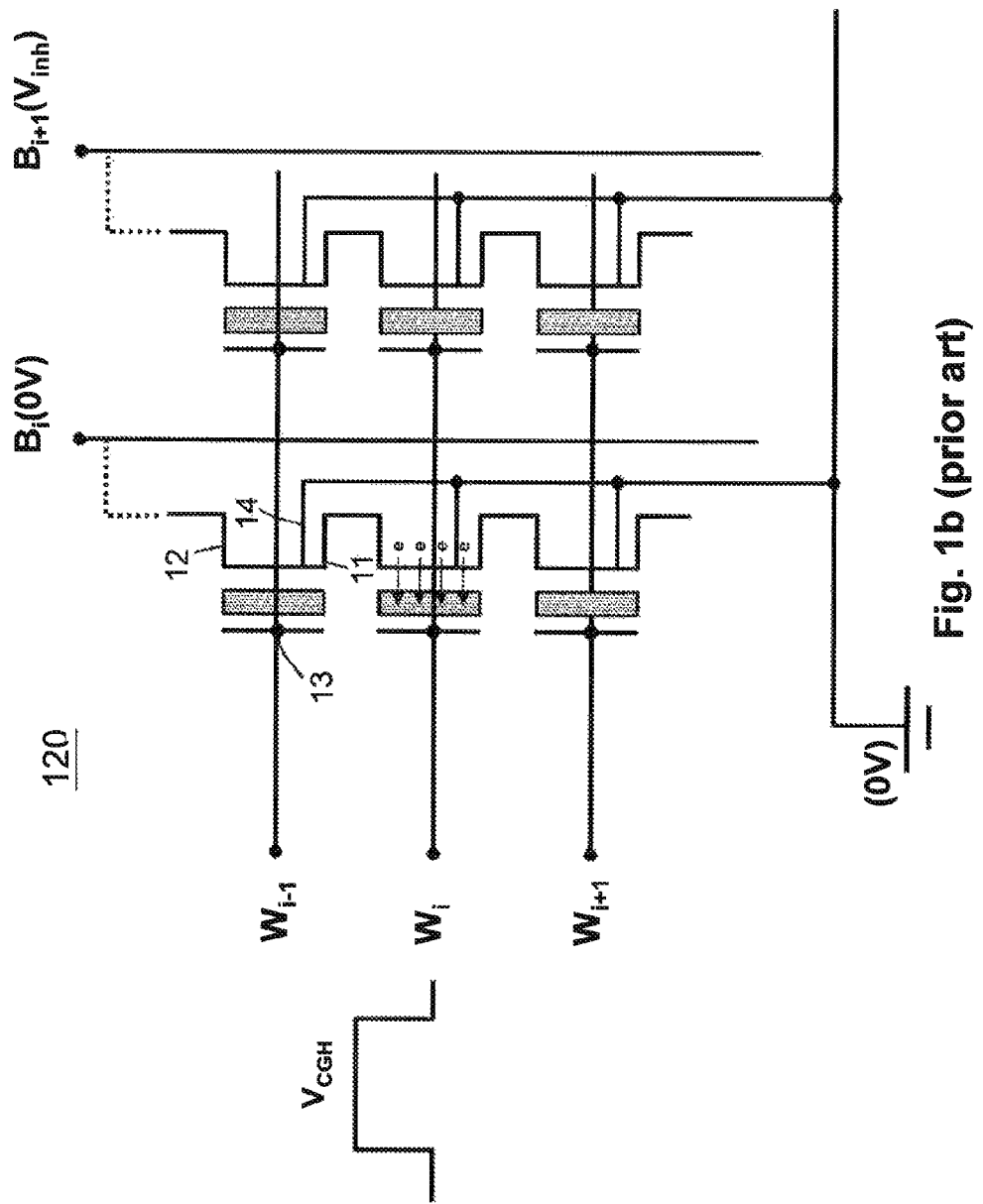

ULTRA-LOW POWER PROGRAMMING METHOD FOR N-CHANNEL SEMICONDUCTOR NON-VOLATILE MEMORY

BACKGROUND OF THE INVENTION

1. Field of the invention

This invention relates to a method for programming N-channel semiconductor Non-Volatile Memory (NVM). In particular, the programming method of the invention obtains ultra-low programming current down below the sub-microampere range per cell with a very low drain voltage bias. Meanwhile, thanks to no applied source-to-drain electrical field from a floating source electrode, the major obstacle for programming nanometer scale gate lengths of N-channel NVM cell devices in NOR-type NVM cell array associated with the source-to-drain punch-through voltage reduction is then avoided.

2. Description of the Related Art

An N-channel Metal Oxide Semiconductor Field Effect Transistor (MOSFET) is constructed with two N-type source/drain electrodes separated by a P-type channel region with a gate electrode over a dielectric layer on top of the channel region. When the gate of the N-channel MOSFET is applied with a positive voltage relative to the source electrode higher than device's threshold voltage, an inverted electron layer can be formed on the MOSEFET channel surface to electrically conduct the N-type source and drain electrodes. The N-channel semiconductor NVM device is constructed by disposing a layer of charge storage material in between the control gate and the channel region of an N-type MOSFET. The charge storage material can be a conducting material such as a highly doped poly-silicon or a metal conductor, charge trapping dielectric such as a nitride film, or a layer of embedded nanocrystals. By placing electrons in the storage material in an N-channel semiconductor NVM, the threshold voltage of the NVM MOSFET device is shifted to a higher threshold voltage. The states of the threshold voltages of the semiconductor NVM devices can be assigned to represent digital information. For example, digital "1" and "0" can be represented by the low threshold voltage state and high voltage state of the semiconductor NVM devices respectively, or vice versa. Since the semiconductor NVM devices are designed to store electrons in the charge storage material for at least ten years without chip power, the digital data stored in the semiconductor NVM are thus non-volatile.

Placing electrons in the charge storage material for semiconductor NVM devices is called "programming" or "writing". The most common programming methods for N-channel semiconductor NVM cell devices are Channel Hot Electron Injection (CHEI) for the NOR-type cell array 110 and Fowler-Nordheim (FN) tunneling for the NAND-type cell array 120 as depicted in FIG. 1a and FIG. 1b, respectively. For the NOR-type cell array 110, the CHEI programming voltage biases are directly applied to the source electrode 11, drain electrode 12, control gate 13, and substrate electrode 14 of the N-channel NVM device to generate electrical fields in both gate direction and drain direction for hot electron injection, while for the NAND-type cell array 120, FN programming voltage biases are applied only to the control gate 13 and substrate electrode 14 to establish the sole electrical field toward the gate direction for tunneling electron injection. The two different programming schemes have resulted in that the NVM gate lengths in NAND-type cell arrays are scaled down below twenty nanometers while the NVM gate lengths in NOR-type cell arrays have come to a halt at sub-micrometers. As the semiconductor NVM cell devices are scaled down for smaller geometries with advanced process technology nodes the gate lengths of NVM devices are necessary to shrink accordingly. For shrinking NVM gate lengths to meet the process technology capability, the punch-through voltages, defined as the maximum applicable source-drain voltage difference at the onset of large source-drain leakage current under the MOSFET "off" condition, are also decreased. According to Semiconductor Industry Association (SIA) specification for a nanometer gate length MOSFET, the minimum source-drain punch-through voltage is 1.8V, which is far less than the non-scalable applied source-drain voltage difference of about 3.5 V to about 5 V required for CHEI programming to the N-channel semiconductor NVM. The decreasing punch-through voltage for short gate length has been becoming the major obstacle for scaling down the nanometer gate lengths in NOR-type NVM cell arrays with advanced process technology nodes.

Band-to-band tunneling has been the major programming method for P-channel NVM devices, where a reverse biased voltage applied to the junction of P-type drain electrode and N-type well electrode facilitates the valence band electrons in P-type drain regions tunneling into the conducting band of the N-type well, and a control gate voltage pulse with a positive amplitude higher than the drain voltage is applied to facilitate the band-to-band tunneling in the gate-overlapped depleted surface drain areas known as the P-channel MOSFET Gate Induced Drain Leakage (GIDL) effect for injecting the energetic electrons into the storing material. On the other hand, the application of band-to-band tunneling has never become the programming method for N-channel NVM devices for the following reasons. First, a positive gate voltage relative to the drain voltage for an N-channel MOSFET does not generate the same GIDL effect in the gate-overlapped surface drain regions as that in P-channel MOSFET. The GIDL effect for an N-channel MOSFET can only occur for applying a negative gate voltage relative to the drain voltage as illustrated in FIG. 2. An applied negative voltage to the control gate 13 would cause the electrons repelled away from the storing material instead in programming the N-channel NVM devices. Second, the junction band-to-band tunneling current in an N-channel NVM device is usually small as the example of the junction current versus reverse biased voltage for a typical N-type source/drain and P-type substrate junction shown in FIG. 3. The dominant band-to-band tunneling junction current is in the sub-microampere range and rather small in comparison with the sub-milliampere range required for the conventional CHEI programming. It is the general belief that applying positive voltages to the control gates with reverse drain voltage biases to facilitate drain-substrate band-to-band for programming N-channel NVM device would be ineffective due to the small junction tunneling currents and lack of correct polarity GIDL effect for attracting electrons. On the contrary, as characteristics of the erased and the programmed devices for the 55 nm gate length NVM devices shown in FIG. 4, we have discovered that the nanometer gate length N-channel NVM device can be programmed by applying a positive control gate voltage pulse with low reverse drain voltage biases to facilitate small junction band-to-band tunneling currents. We have also observed that abruptly increasing impurity concentrations in the retrograded P-type channel region and the channel edges from halo ion implantation in the nanometer gate length MOSFET design is correlated to the programming mechanism. It is plausible that the increasing density of energetic secondary electrons generated by the collision energy transfer from heavy holes accelerated in the high gradient electric field from the abrupt impurity distributions near the P-type channel surface is responsible for the enhancement of electron injection efficiency.

SUMMARY OF THE INVENTION

According to the Hot Electron Injection (HEI) programming scheme of the invention, an N-type semiconductor Non-Volatile Memory (NVM) device 500 as shown in FIG. 5 consists of an N-type source electrode 510 and an N-type drain electrode 520 in P-type substrate 530. The control gate 550 is at the top of the P-type substrate 530 with a stack of layers of coupling dielectrics 551, storing material 552, and tunneling dielectric 553 in between to form the channel region of the NVM cell. The source electrode 510 of the N-type semiconductor NVM device 500 must be floating with no voltage biases to prevent applied electrical fields toward the drain electrode 520, substrate electrode 530, and gate electrodes 550, respectively. The drain electrode 520 is biased with a positive voltage $V_D$ relatively to the substrate voltage $V_B$ such that the drain-to-substrate junction is reversely biased to facilitate junction band-to-band tunneling. $V_{DB}$ ($V_D$-$V_B$) is greater than 0V and, preferably, in the range of about 2V to about 6V for typical silicon N/P junctions. A high voltage pulse with the amplitude $V_{CGH}$>$V_D$ is then applied to the control gate 550 of the N-type NVM devices 500 to attract hot electrons toward the storing material 552, where $V_D$ is the applied drain voltage and equals $V_{DB}$ for $V_B$=0V (substrate grounded). Note that the grounded substrate voltage is provided by way of example and not limitation of the invention. The substrate electrode 530 of the N-type NVM device can be applied with any voltage biases as long as a reverse voltage bias $V_{DB}$ is created.

It is also appreciated that, in different aspects of this invention, the programming schemes can be applied in different N-type semiconductor NVM structure variations.

BRIEF DESCRIPTION OF THE DRAWINGS

For a better understanding of the present invention and to show how it may be carried into effect, reference will now be made to the following drawings, which show the preferred embodiment of the present invention, in which:

FIG. 1b illustrates a Fowler-Nordheim (FN) tunneling programming method applied in a portion of a NAND-type cell array.

DETAILED DESCRIPTION OF THE INVENTION

The following detailed description is meant to be illustrative only and not limiting. It is to be understood that other embodiment may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items.

Figure 1A:
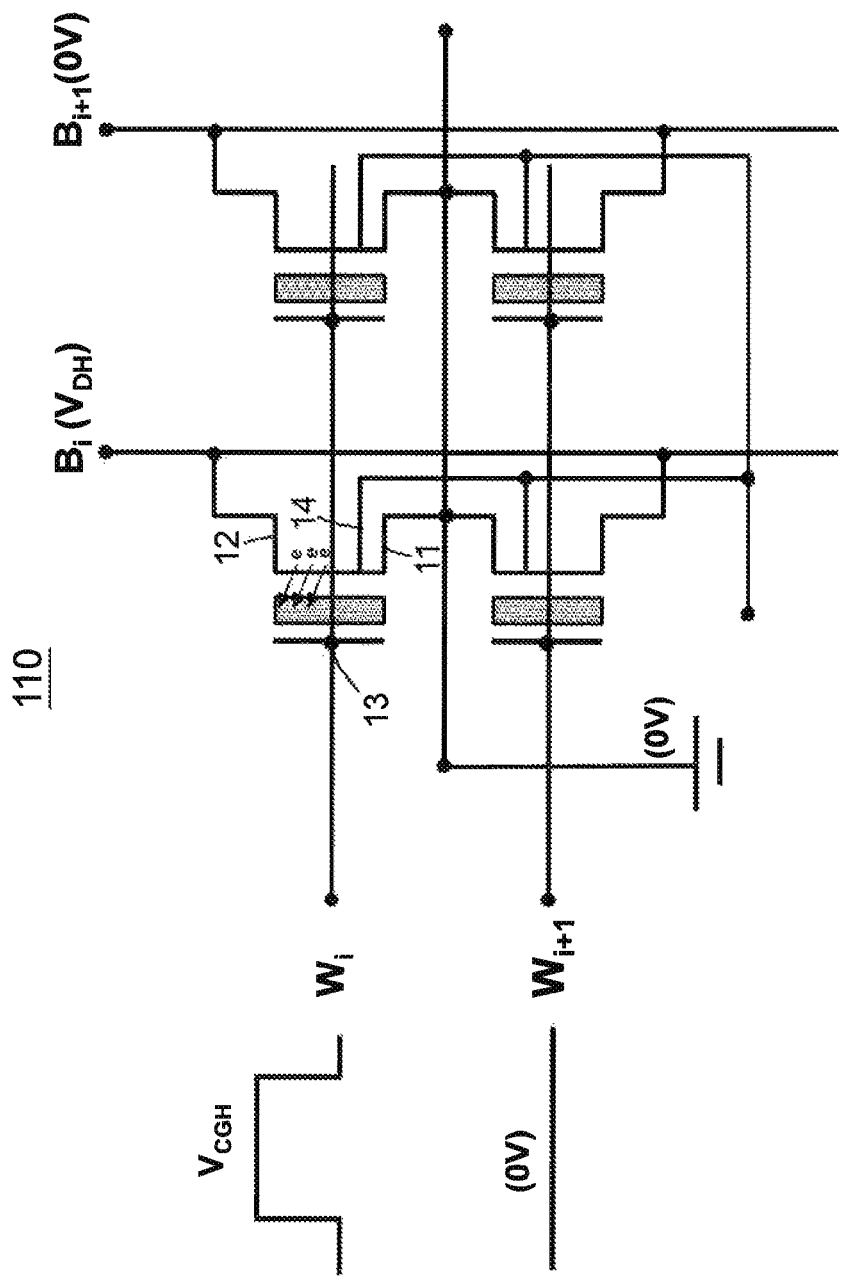
FIG. 1a illustrates a conventional Channel Hot Electron Injection (CHEI) programming method applied in a portion of a NOR-type cell array.
Figure 2:
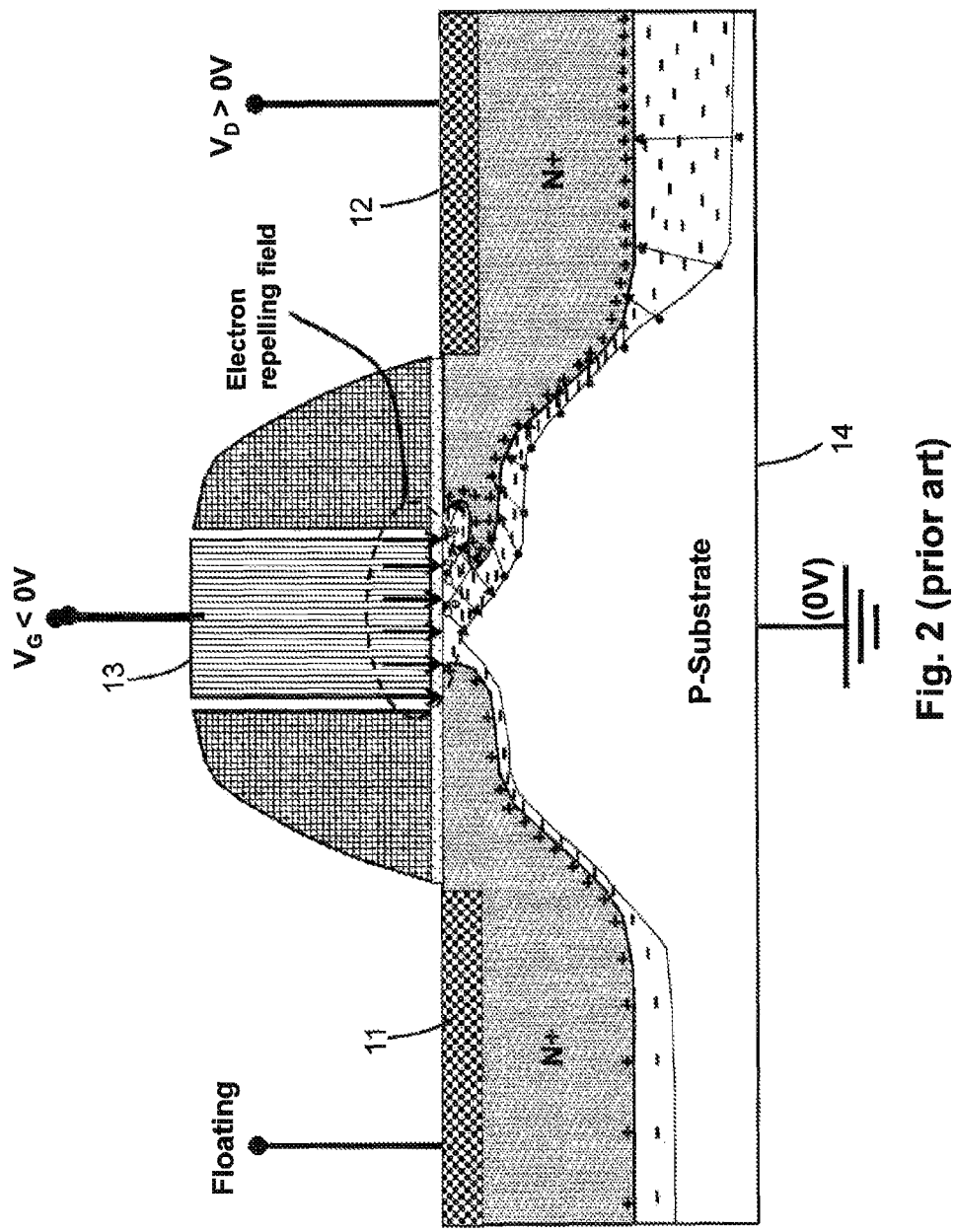
FIG. 2 illustrates the GIDL effect for an N-channel MOSFET by applying a negative gate voltage according to prior arts.
Figure 3:
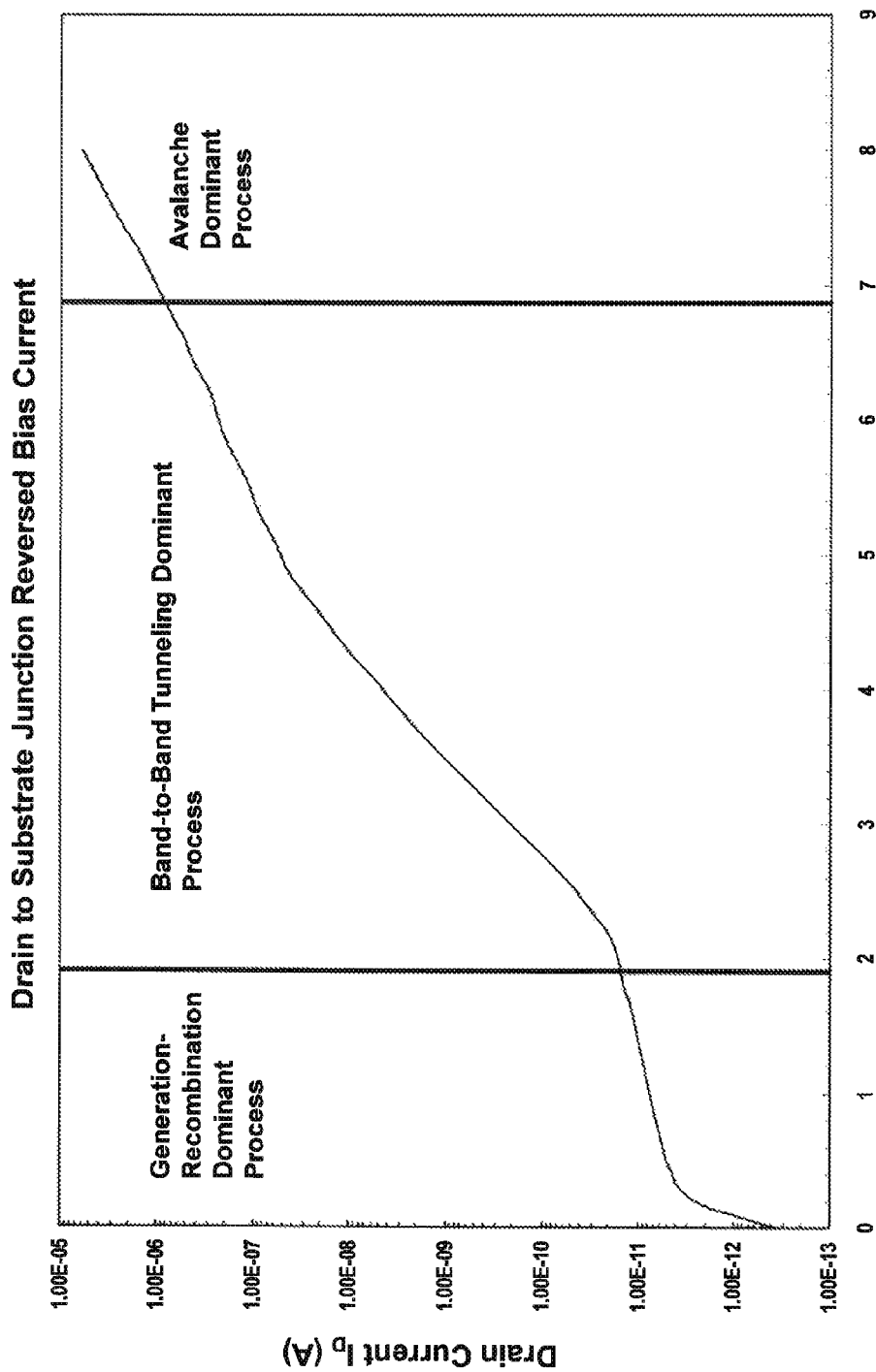
FIG. 3 shows the junction current versus reverse biased voltage for a typical N-type source/drain and P-type substrate junction of an N-channel NVM device.
Figure 4:
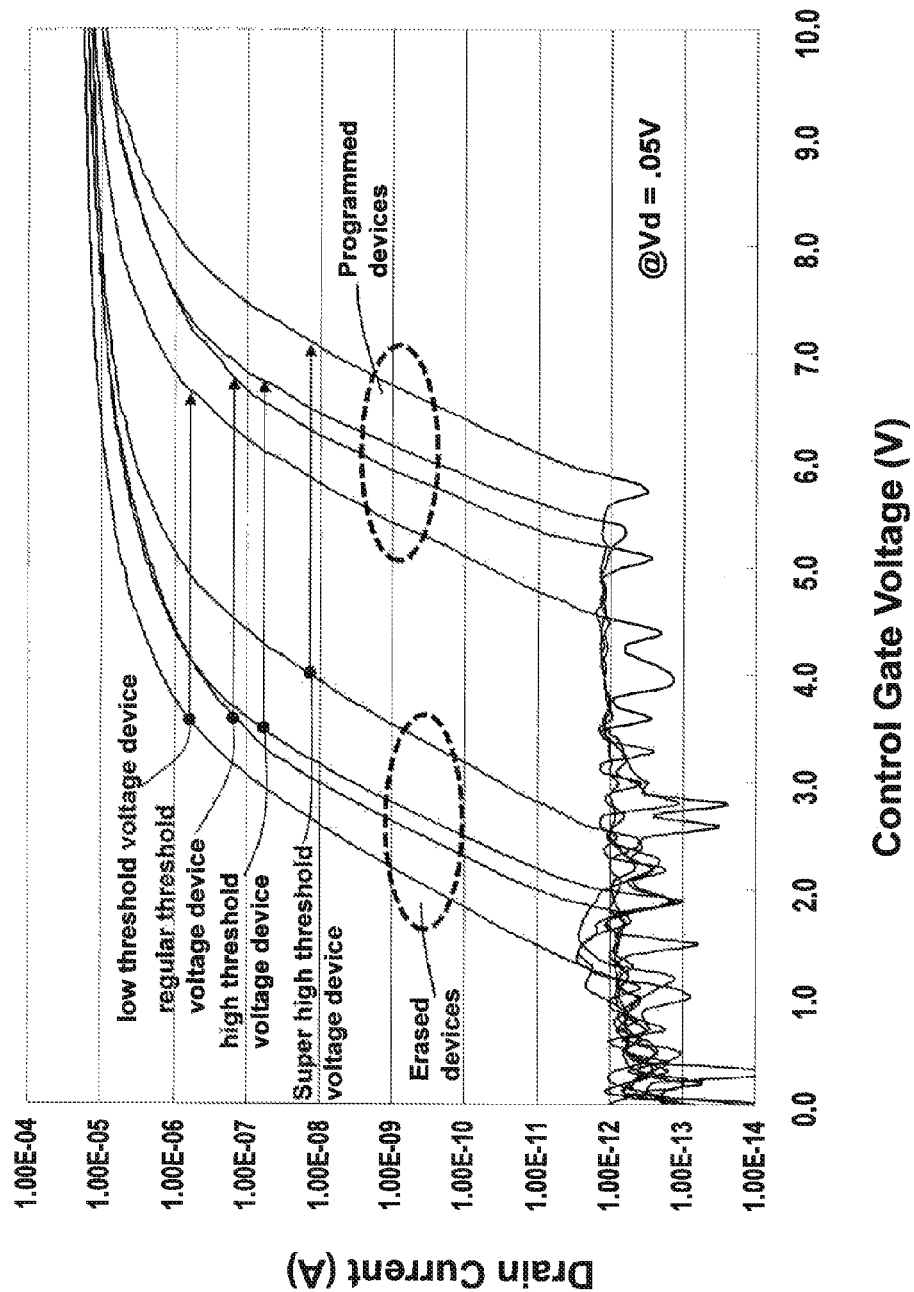
FIG. 4 shows exemplary characteristics for erased and programmed NVM devices with the 55 nm gate length using the programming method according to this invention.
Figure 5:
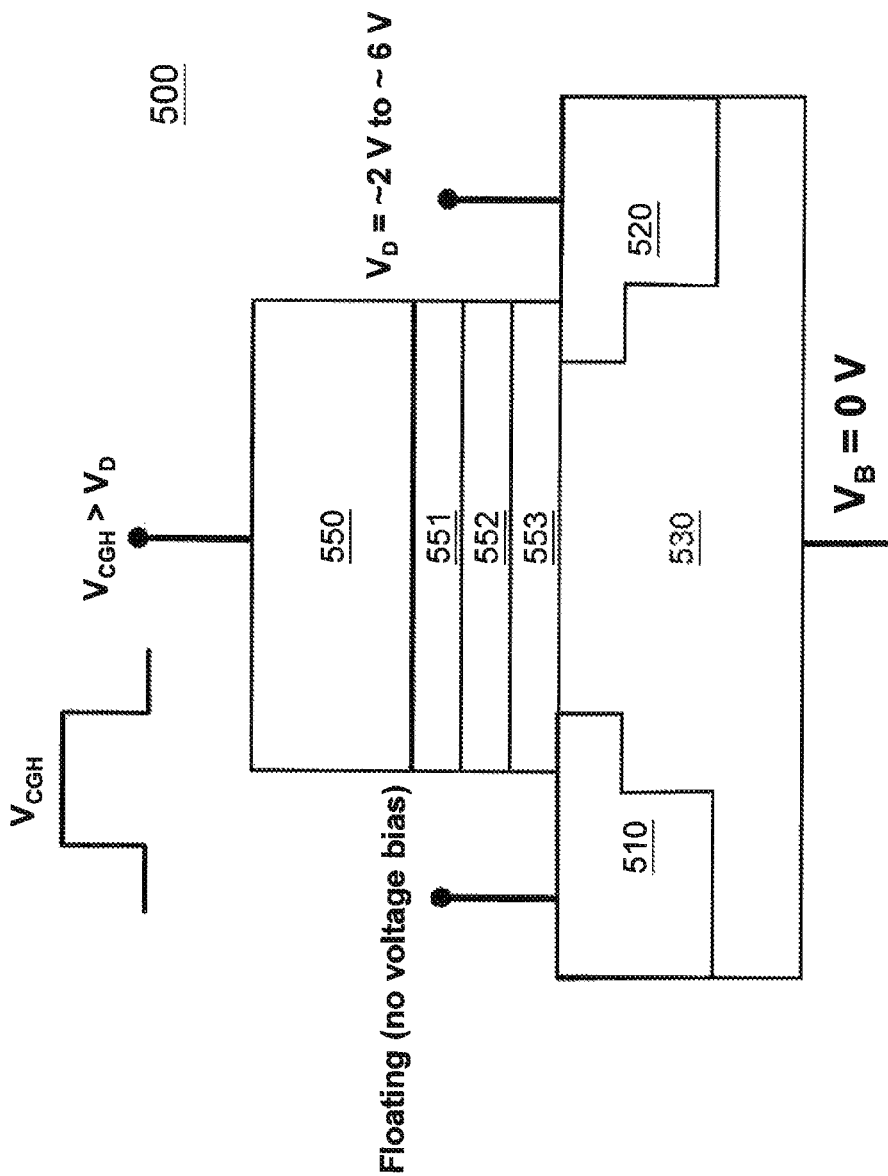
FIG. 5 shows the applied voltage biases for a typical N-type semiconductor NVM device according to this invention.
Figure 6:
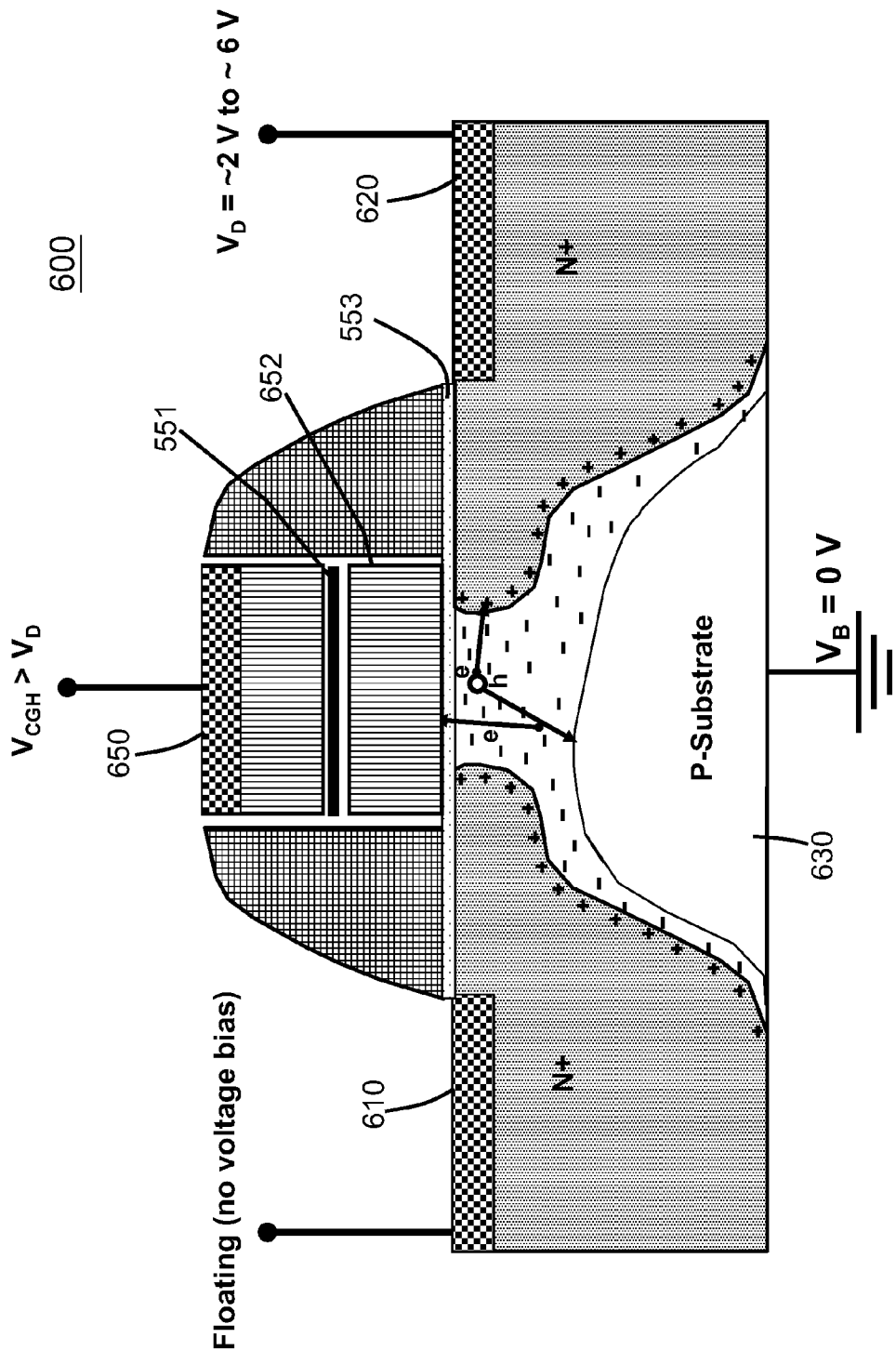
FIG. 6 shows the applied voltage biases for an N-type floating gate NVM device (cross-section view) according to one embodiment of this invention.

In one embodiment, an N-type floating gate Non-Volatile Memory (NVM) device 600 is shown in FIG. 6. To program the N-type floating gate NVM devices 600, the source electrode 610 of the NUM device is floating from any voltage bias and the drain electrode 620 is applied with a voltage bias $V_D$ such that the drain/substrate junction is reversely biased. $V_{DB}$ ($v_D$-$V_B$) is greater than 0V and preferably in the range of about 2V to about 6V to facilitate the junction band-to-band tunneling. A high voltage pulse with the amplitude $V_{CGH}$>$V_D$ is then applied to the control gate 650 of the N-type floating gate NVM devices 600 for several μs to attract hot electrons toward the storing material (floating gate) 652, where $V_D$ is the applied drain voltage and equals $V_{DB}$ for $V_B$=0V (substrate grounded).

Figure 7:
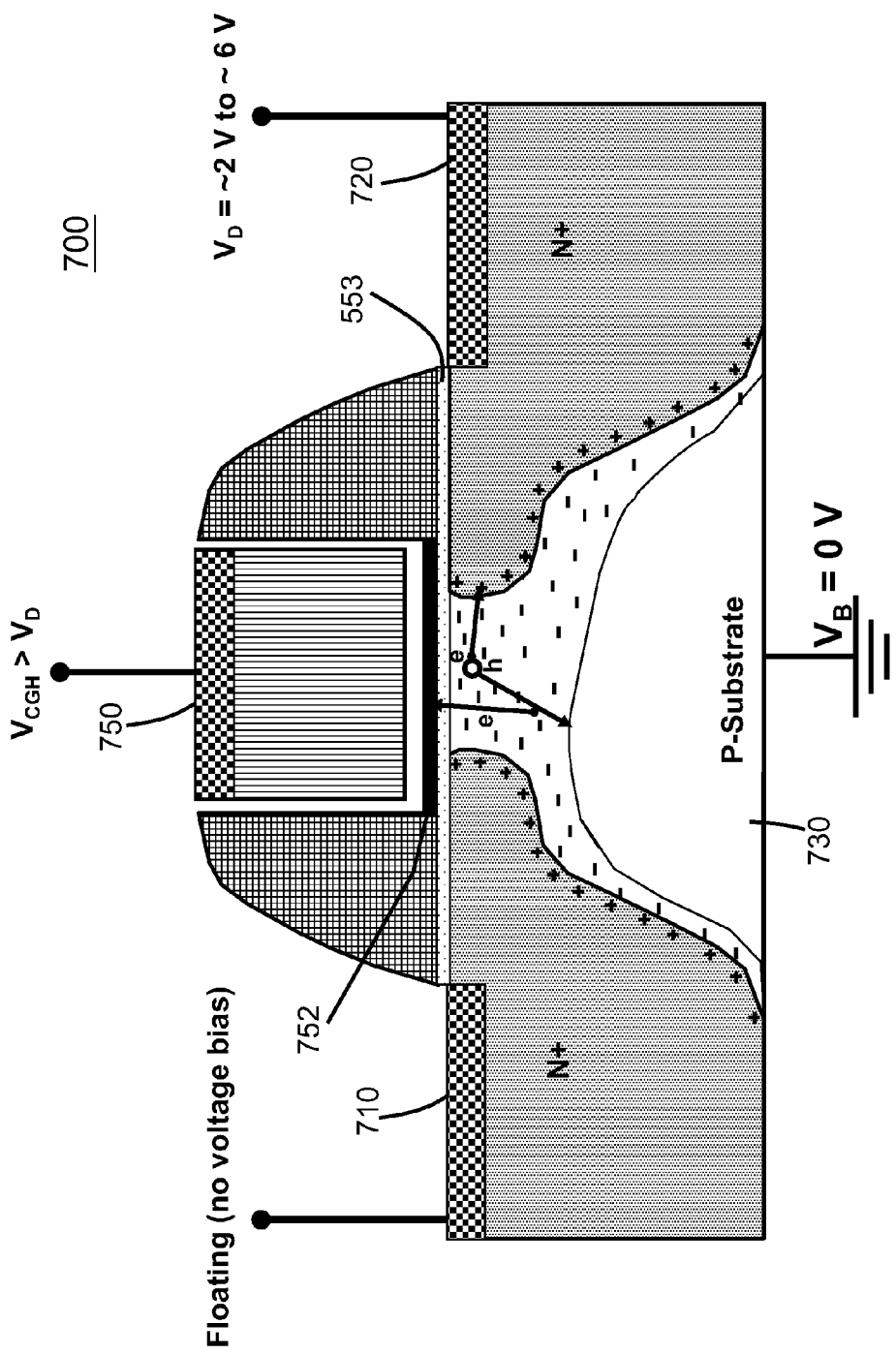
FIG. 7 shows the applied voltage biases for an N-type dielectric film NUM device (cross-section view) according to one embodiment of this invention.

In another embodiment, an N-type charge trap Non-Volatile Memory (NVM) device 700 is shown in FIG. 7. To program the N-type charge trap NUM device 700, the source electrode 710 of the NUM device is floating from any voltage bias and the drain electrode 720 is applied with a voltage bias $V_D$ such that the drain/substrate junction is reversely biased. $V_{DB}$ ($V_D$-$V_B$) is greater than 0V and preferably in the range of about 2V to about 6V to facilitate the junction band-to-band tunneling. A high voltage pulse with the amplitude $V_{CGH}$>$V_D$ is then applied to the control gate 750 of the N-type charge trap NUM devices 700 for several μs to attract hot electrons toward the dielectric film (storing material) 752, where $V_D$ is the applied drain voltage and equals $V_{DB}$ for $V_S$=0V (substrate grounded).

Figure 8:
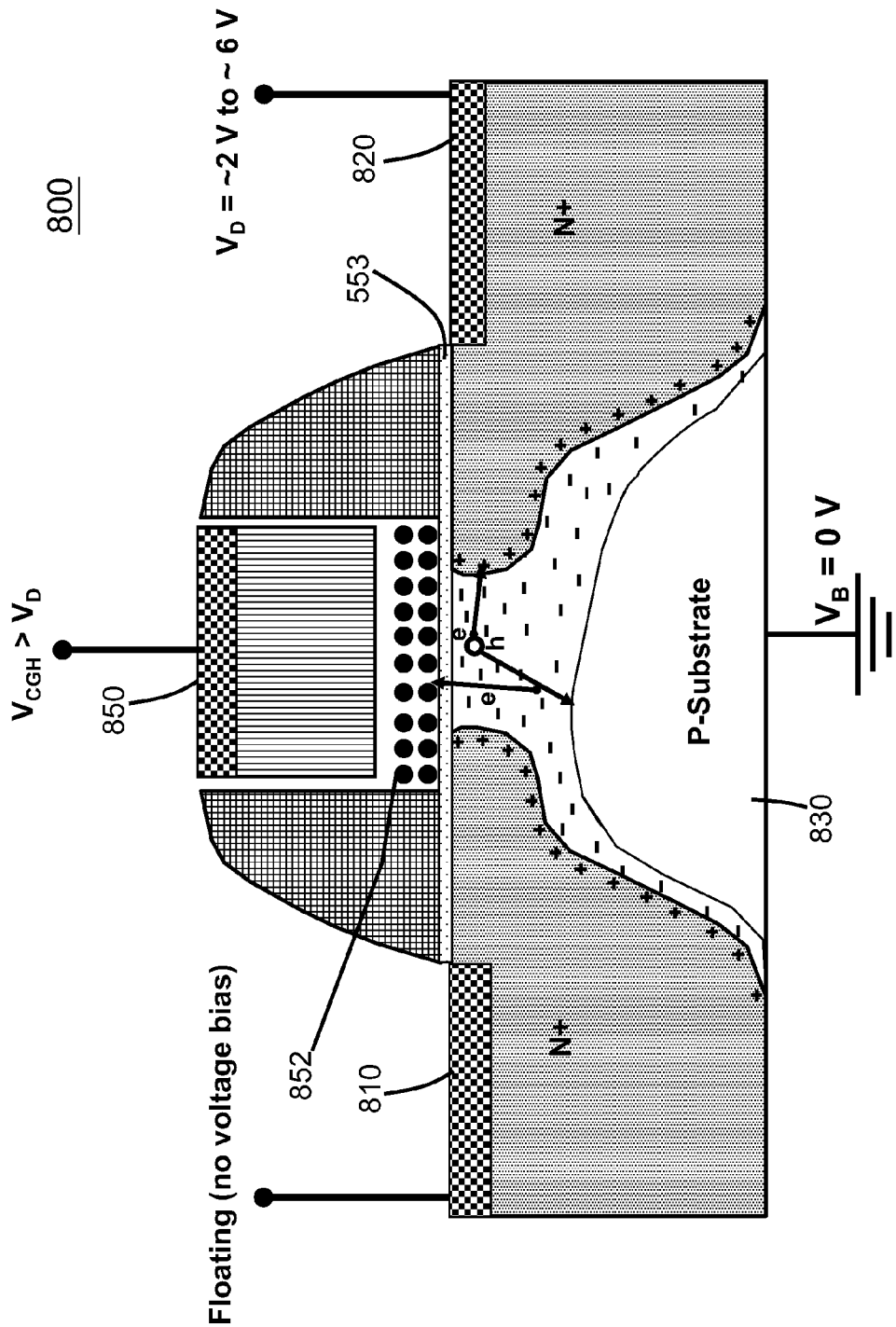
FIG. 8 shows the applied voltage biases for an N-type nano-crystal NVM device (cross-section view) according to one embodiment of this invention.

In another embodiment, an N-type nano-crystal non-volatile memory device 800 is shown in FIG. 8. To program the N-type nano-crystal NVM devices 800, the source electrode 810 of the NVM device is floating from any voltage bias and the drain electrode 820 is applied with a voltage bias $V_D$ such that the drain/substrate junction is reversely biased. $V_{DB}$ ($V_D$-$V_B$) is greater than 0V and preferably in the range of about 2V to about 6V to facilitate the junction band-to-band tunneling. A high voltage pulse with the amplitude $V_{CGH}$>$V_D$ is then applied to the control gate 850 of the N-type nano-crystal NVM devices 800 for several μs to attract hot electrons toward the nano-crystals (storing material) 852, where $V_D$ is the applied drain voltage and equals $V_{DB}$ for $V_B$=0V (substrate grounded).

Figure 9:
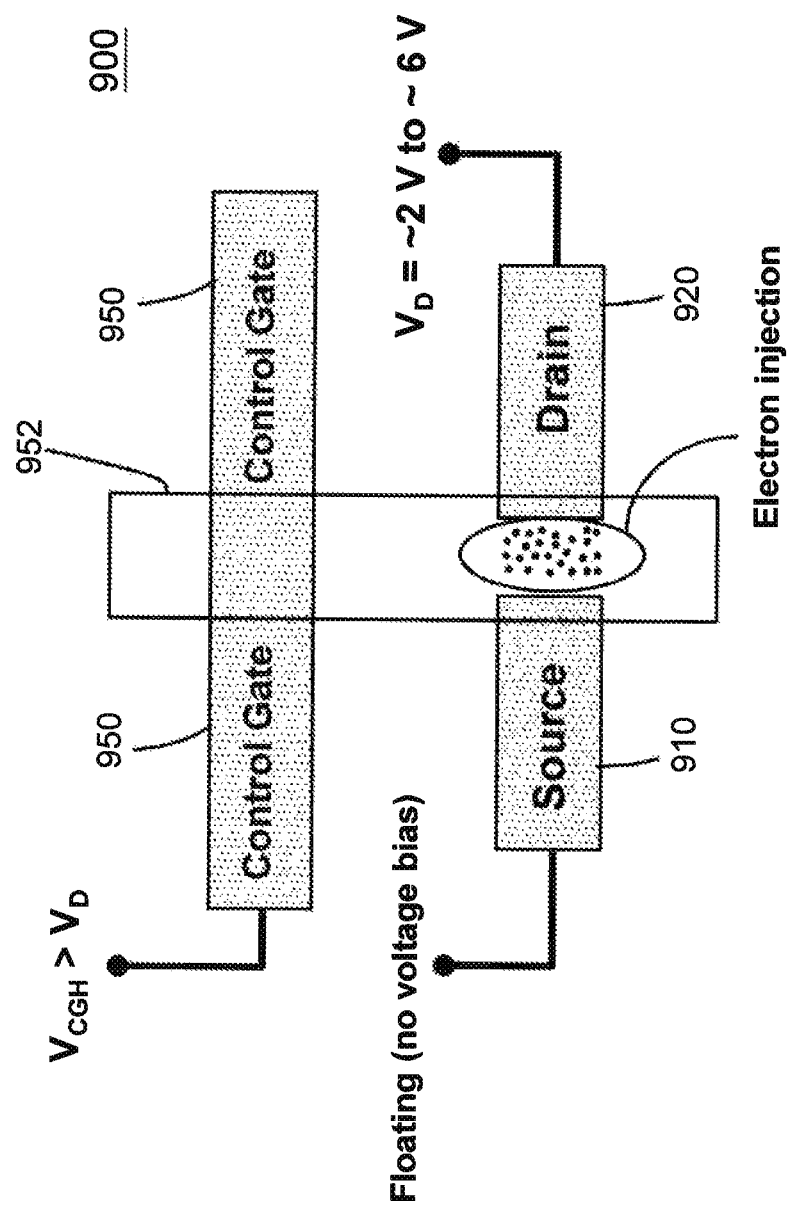
FIG. 9 shows the applied voltage biases for an N-type single gate logic NVM device (top planar view) according to one embodiment of this invention.

In another embodiment, an N-type single gate logic non-volatile memory device 900 is shown in FIG. 9. To program the N-type single gate logic NVM devices 900, the source electrode 910 of the NVM device is floating from any voltage bias and the drain electrode 920 is applied with a voltage bias such that the drain/substrate junction is reversely biased. $V_{DB}$ ($V_D$-$V_B$) is greater than 0V and preferably in the range of about 2V to about 6V to facilitate the junction band-to-band tunneling. A high voltage pulse with the amplitude $V_{CGH}$>$V_D$ is then applied to the control gate 950 of the N-type single gate logic NVM devices 900 for several μs to attract hot electrons toward the single floating gate (storing material) 952, where $V_D$ is the applied drain voltage and equals $V_{DB}$ for $V_B$=0V (substrate grounded).

In summary, the Hot Electron Injection (HEI) programming methods of the invention have been disclosed. The methods of the invention with low applied voltages and low programming currents lead to fast parallel programming and the simplified peripheral circuit design in semiconductor nonvolatile memories.

What is claimed is:

1. A method for programming an N-type nonvolatile memory (NVM) cell formed in a substrate, the N-type NVM cell having a source, a drain, a charge storing material and a control gate, the method comprising the steps of:
   floating the source;
   applying a first voltage bias to the drain and a second voltage bias to the substrate respectively so that a drain-to-substrate junction is reverse-biased; and
   applying a voltage pulse to the control gate for a predetermined time interval to attract hot electrons toward the storing material after completion of the steps of floating the source and applying the first voltage bias to the drain and the second voltage bias to the substrate respectively;
   wherein a voltage level of the voltage pulse is greater than the first voltage bias; and
   wherein the voltage level of the voltage pulse relative to the second voltage bias is greater than zero.

2. The method according to claim 1, wherein the first voltage bias relative to the second voltage bias is greater than zero.

3. The method according to claim 2, wherein the first voltage bias relative to the second voltage bias is in the range of two volts to six volts.

4. The method according to claim 1, wherein the predetermined time interval is in the range of microseconds.

5. The method according to claim 1, wherein the N-type NVM cell is one of an N-type floating gate NVM cell, an N-type dielectric film NVM cell, an N-type nano-crystal NVM cell and an N-type single gate logic NVM cell.

* * * * *